(12) United States Patent
Mescher et al.

(10) Patent No.: US 10,886,235 B2
(45) Date of Patent: *Jan. 5, 2021

(54) INTEGRATED SHIELD PACKAGE AND METHOD

(71) Applicant: Amkor Technology, Inc., Tempe, AZ (US)

(72) Inventors: Paul Mescher, Chandler, AZ (US); Danny Brady, Chandler, AZ (US)

(73) Assignee: AMKOR TECHNOLOGY SINGAPORE HOLDING PTE. LTD., Singapore (SG)

(*) Notice: Subject to any disclaimer, the term of this patent is extended or adjusted under 35 U.S.C. 154(b) by 172 days.

This patent is subject to a terminal disclaimer.

(21) Appl. No.: 16/166,751

(22) Filed: Oct. 22, 2018

(65) Prior Publication Data

US 2019/0057941 A1 Feb. 21, 2019

Related U.S. Application Data

(63) Continuation of application No. 13/169,385, filed on Jun. 27, 2011, now Pat. No. 10,109,591.

(51) Int. Cl.

| | |
|---|---|
| *H01L 23/552* | (2006.01) |
| *H01L 23/522* | (2006.01) |
| *H01L 23/488* | (2006.01) |
| *H01L 23/60* | (2006.01) |
| *H01L 21/56* | (2006.01) |
| *H01L 23/367* | (2006.01) |

(Continued)

(52) U.S. Cl.
CPC .......... *H01L 23/552* (2013.01); *H01L 21/563* (2013.01); *H01L 23/3675* (2013.01); *H01L 23/488* (2013.01); *H01L 23/5225* (2013.01); *H01L 23/60* (2013.01); *H01L 23/15* (2013.01); *H01L 23/49816* (2013.01); *H01L 23/49827* (2013.01); *H01L 2224/16225* (2013.01); *H01L 2224/32225* (2013.01); *H01L 2224/73204* (2013.01); *H01L 2224/73253* (2013.01); *H01L 2924/15311* (2013.01)

(58) Field of Classification Search
CPC .................................................. H01L 51/5243
See application file for complete search history.

(56) References Cited

U.S. PATENT DOCUMENTS

| | | |
|---|---|---|
| 7,254,032 B1 | 8/2007 | Xue et al. |
| 7,759,168 B2 | 7/2010 | Behun et al. |
| 2003/0015789 A1 | 1/2003 | Zuo et al. |

(Continued)

*Primary Examiner* — Mohammad M Choudhry
(74) *Attorney, Agent, or Firm* — McAndrews, Held & Malloy, Ltd.

(57) ABSTRACT

An integrated shield electronic component package includes a substrate having as upper surface, a lower surface, and sides extending between the upper surface and the lower surface. An electronic component is mounted to the upper surface of the substrate. An integrated shield is mounted to the upper surface of the substrate and includes a side shielding portion directly adjacent to and covering the sides of the substrate. The integrated shield covers and provides an electromagnetic interference (EMI) shield for the electronic component, the upper surface and sides of substrate. Further, the integrated shield is integrated within toe integrated shield electronic package. Thus, separate operations of mounting an electronic component package and then mounting a shield are avoided thus simplifying manufacturing and reducing overall assembly costs.

19 Claims, 4 Drawing Sheets

(51) Int. Cl.
  *H01L 23/15*   (2006.01)
  *H01L 23/498*   (2006.01)

(56) References Cited

U.S. PATENT DOCUMENTS

| | | |
|---|---|---|
| 2003/0122242 A1 | 7/2003 | Takeuchi |
| 2006/0063310 A1 | 3/2006 | Jadhav et al. |
| 2007/0132083 A1 | 6/2007 | Ito et al. |
| 2007/0231953 A1 | 10/2007 | Tomita et al. |
| 2010/0109152 A1 | 5/2010 | Kariyazaki |
| 2012/0039046 A1 | 2/2012 | Beaumier et al. |

US 10,886,235 B2

INTEGRATED SHIELD PACKAGE AND METHOD

TECHNICAL FIELD

The present application relates to the field of electronics, and more particularly, to methods of forming electronic component packages and related structures.

BACKGROUND

An electronic component package generates electromagnetic radiation, which can interfere with surrounding devices in a board assembly. The generated electromagnetic radiation is sometimes called electromagnetic interference (EMI). Generally, it is desirable to provide shielding to prevent the EMI from the electronic component package from interfering with surrounding devices as well as to prevent any EMI from the surrounding devices from interfering with the electronic component package.

BRIEF DESCRIPTION OF THE DRAWINGS

In the following description, the same or similar elements are labeled with the same or similar reference numbers.

DETAILED DESCRIPTION

Figure 1:
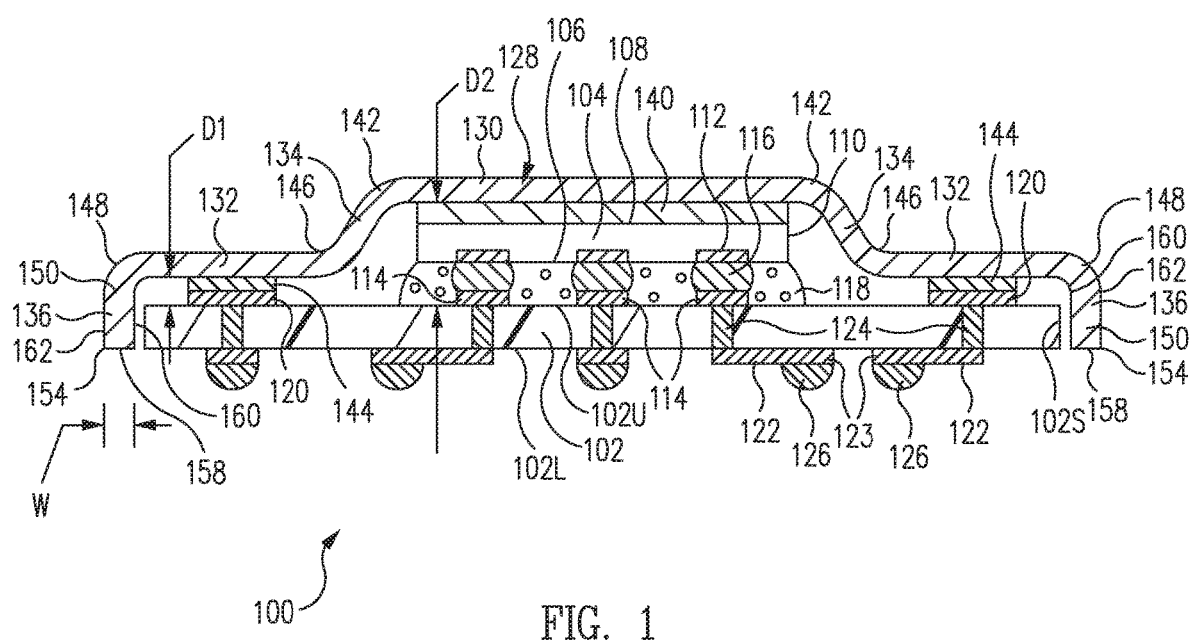
FIG. 1 is a cross-sectional view of an integrated shield electronic component package in accordance with one embodiment.
Figure 2:
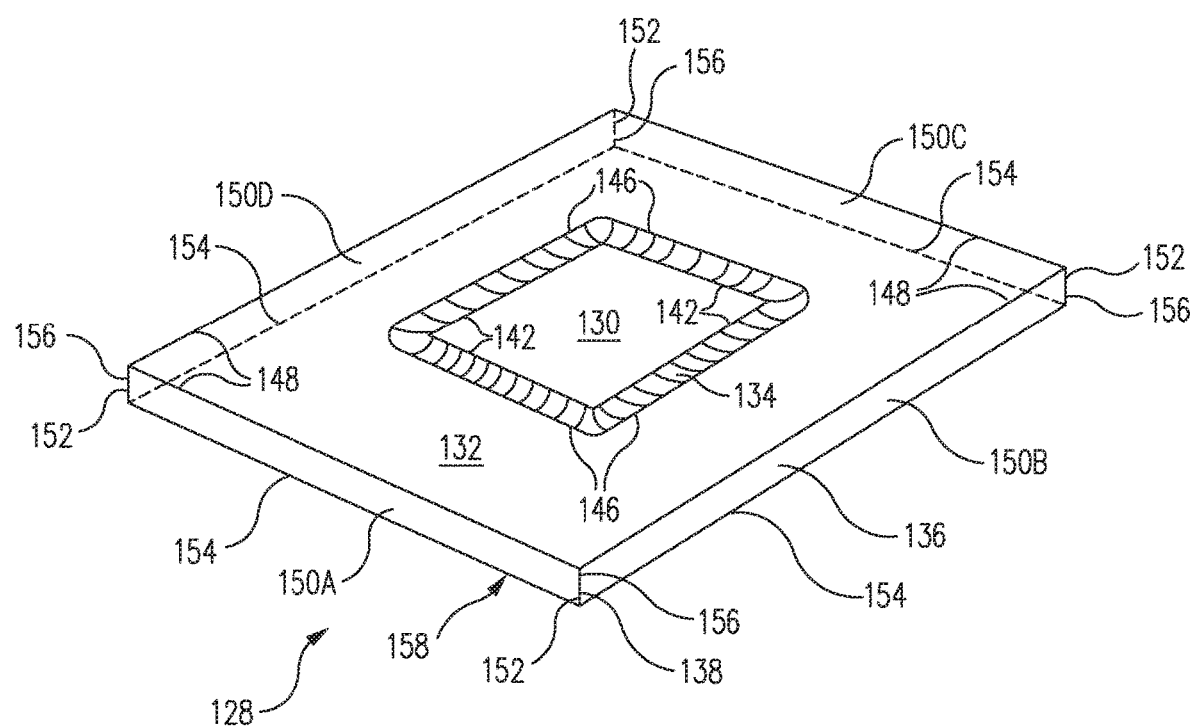
FIG. 2 is a top perspective view of an integrated shield of the integrated shield electronic component package of FIG. 1 in accordance with one embodiment.

As an overview and in accordance with one embodiment, referring to FIGS. 1 and 2 together, an integrated shield electronic component package 100 includes a substrate 102 having an upper surface 102U, a lower surface 102L, and sides 102S extending between. upper surface 102U and lower surface 102L. An electronic component 104 is mounted to upper surface 102U of substrate 102.

An integrated shield 128 is mounted to upper surface 102U of substrate 102. Integrated shield 128 covers electronic component 104 and upper surface 102U of substrate 102. Integrated shield 128 includes a side shielding portion 136 directly adjacent to and covering sides 102S of substrate 102.

Integrated shield 128 covers and provides an electromagnetic interference (EMI) shield for electronic component 104 and upper surface 102U of substrate 102. Further, by covering sides 102S of substrate 102, side shielding portion 136 provides an EMI shield for sides 102S of substrate 102.

Further, integrated shield 128 is integrated within integrated shield electronic package 100. Thus, separate operations of mounting an electronic component package and then mounting a shield are avoided thus simplifying manufacturing and reducing overall assembly costs.

Now in more detail, FIG. 1 is a cross-sectional view of an integrated shield electronic component package 100 in accordance with one embodiment. Integrated shield electronic component package 100 includes a substrate 102. Substrate 102 is a dielectric material such as laminate, ceramic, printed circuit board material, or other dielectric material.

Substrate 102 includes an upper, e.g., first, surface 102U and an opposite lower, e.g., second, surface 102L. Substrate 102 further includes sides 102S, sometimes called substrate edges, extending perpendicularly between upper surface 102U and lower surface 102L. Although the terms parallel, perpendicular, and similar terms are used herein, it is to be understood that the described features may not be exactly parallel and perpendicular, but only substantially parallel and perpendicular to within accepted manufacturing tolerances.

Integrated shield electronic component package 100 further includes an electronic component 104, e.g., a single die. In one embodiment, electronic component 104 is an integrated circuit chip, e.g., an active component such as a high frequency ASIC device. However, in other embodiments, electronic component 104 is a passive component such as a capacitor, resistor, or inductor. Further, in one embodiment, electronic component 104 includes two or more stacked dies.

In accordance with this embodiment, electronic component 104 is a single die and includes an active surface 106, an opposite inactive surface 108, and sides 110 extending perpendicularly between active surface 106 and inactive surface 108. Electronic component 104 further includes bond pads 112 formed on active surface 106.

Formed on upper surface 102U of substrate 102 are one or more electrically conductive upper, e.g., first, traces 114, e.g., formed of copper. In accordance with. this embodiment, bond pads 112 are electrically and physically connected to upper traces 114, e.g., bond fingers thereof, by flip chip bumps 116, e.g., solder bumps, extending between bond pads 112 and upper traces 114. Generally, electronic component 104 is mounted to upper surface 102U of substrate 102.

Optionally, a dielectric underfill 118 is applied between upper surface 102U of substrate 102 and active surface 106 of electronic component 104 and encloses flip chip bumps 116.

Further, formed on upper surface 102U of substrate 102 are one or more electrically conductive ground terminals 120, e.g., formed of copper. Ground terminals 120 are formed on the outer periphery of upper surface 102U adjacent sides 102S. Upper traces 114 are formed inward of ground terminals 120 in one embodiment.

Formed on lower surface 102L of substrate 102 are lower, e.g., second, traces 122. Lower traces 122 are electrically connected to upper traces 114 and/or ground terminals 120 by electrically conductive vias 124 extending through substrate 102 between upper surface 102U and lower surface 102L.

In one embodiment, an upper trace 114 and a ground terminal(s) 120 are coupled to the same lower trace 122. For example, where a reference voltage source, e.g., ground, is to be provided to ground terminals 120 and also to a ground bond pad of bond pads 112, the respective upper trace 114 and ground terminal(s) 120 are connected to the same lower trace 122, although can be connected to different lower traces 122 in other embodiments.

Although not illustrated in FIG. 1, in one embodiment, integrated shield electronic component package 100 further includes solder masks on upper and lower surface 102U, 102L that protect first portions of upper and lower traces 114, 122 while exposing second portions, e.g., terminals and/or bond fingers, of upper and lower traces 114, 122 and also exposing ground terminals 120.

Formed on terminals 123 of lower traces 122 and generally on lower surface 102L of substrate 102 are electrically conductive interconnection balls 126, e.g., solder balls in a ball grid array (BGA). In another embodiment, interconnection balls 126 are not formed, e.g., to form a land grid array (LGA). Although BGA and LGA package configurations are set forth, in other embodiments, integrated shield electronic component package 100 is formed with other package configurations.

Although a particular electrically conductive pathway between bond pads 112/ground terminals 120 and interconnection balls 126 is described above, other electrically conductive pathways can be formed. For example, contact metallizations can be formed between the various electrical conductors.

Further, instead of straight though vias 124, in one embodiment, substrate 102 is a multilayer substrate and a plurality of vias and/or internal traces form the electrical interconnection between upper traces 114/ground terminals 120 and lower traces 122.

Although flip chip bumps 116 appear larger than interconnection balls 126 in FIG. 1, in light of this disclosure, those of skill in the art will understand. that the figure is not to scale. Typically, flip chip bumps 116 are significantly smaller than interconnection balls 126. Accordingly, in various embodiments, flip chip bumps 116 are larger, equal to, or smaller than interconnection balls 126.

Integrated shield electronic component package 100 further includes an integrated shield. 128. Integrated shield 128 is formed of an electrically conductive material, e.g., copper, aluminum, or other electrically conductive material.

FIG. 2 is a top perspective view of integrated shield 128 of integrated shield electronic component package 100 of FIG. 1 in accordance with one embodiment. Referring now to FIGS. 1 and 2 together, integrated. shield 128 includes an electronic component shielding portion 130, a substrate shielding portion 132, an electronic component to substrate transition shielding portion 134, and a side shielding portion 136.

In one embodiment, integrated shield 128 is a single piece and not a plurality of separate pieces connected together. More particularly, in accordance with this embodiment, electronic component shielding portion 130, substrate shielding portion 132, electronic component to substrate transition shielding portion 134, and side shielding portion 136 are all portions (regions) of a single piece of conductive material, e.g., copper, aluminum, or other electrically conductive material.

In one embodiment, integrated shield 128 is continuous, i.e., does not include any cuts therein. For example, integrated shield 128 is formed by stamping, bending, or other metal shaping technique.

In another embodiment, integrated shield 128 has one or more cuts, sometimes called gaps or spaces, where portions of integrated shield 128 are folded together. For example, side shielding portion 136 is rectangular pieces extending from substrate shielding portion 132. The rectangular pieces of side shielding portion 136 are bent downwards from substrate shielding portion 132 to contact the adjacent rectangular pieces. Accordingly, cuts 138 (see FIG. 2) exist between adjacent rectangular pieces of side shielding portion 136.

In accordance with this embodiment, electronic component shielding portion 130 of integrated shield 128 is mounted to inactive surface 108 of electronic component 104 with a thermal interface material (TIM) 140.

Generally, thermal interface material 140 has a high thermal conductivity and ensures good thermal contact between inactive surface 108 of electronic component 104 and integrated shield 128. Accordingly, heat generated by electronic component 104 is conducted through thermal interface material 140 and to integrated shield 128, which dissipates the heat to the ambient environment. In this manner, integrated shield 128 operates as a heat sink.

In various embodiments, thermal interface material 140 includes thermal grease, paste, adhesive such as epoxy, solder, or other thermally conductive material. In one embodiment, thermal interface material 140 is a dielectric material such that inactive surface 108 of electronic component 104 is electrically isolated from integrated shield 128.

In another embodiment, thermal interface material 140 is electrically conductive material, e.g., an electrically conductive adhesive or solder. In accordance with this embodiment, inactive surface 108 of electronic component 104 is electrically coupled to integrated shield. 128 by thermal interface material 140.

Electronic component shielding portion 130 of integrated shield 128 has the same shape as inactive surface 108 of electronic component 104. Although electronic component shielding portion 130 of integrated shield 128 is said to have the same shape as inactive surface 108 of electronic component 104, in light of this disclosure, those of skill in the art will understand. that the shapes may not be exactly identical, but substantially identical, to within accepted manufacturing tolerances. For example, electronic component shielding portion 130 may be slightly larger than inactive surface 108 to insure that inactive surface 108 fits within the area of electronic component shielding portion 130.

In accordance with this embodiment, electronic component shielding portion 130 is rectangular and has four edges 142. Electronic component shielding portion 130 is parallel to inactive surface 108 and upper surface 102U of substrate 102.

In accordance with this embodiment, substrate shielding portion 132 of integrated shield 128 is electrically and physically connected to ground terminals 120 by shield attach material 144. Shield attach material 144 is electrically conductive, e.g., is solder or electrically conductive adhesive. Generally, substrate shielding portion 132 of integrated shield 128 is coupled to upper surface 102U of substrate 102.

Accordingly, a reference voltage source, e.g., ground, applied to ground terminals 120 is coupled to integrated shield 128 through shield attach material 144. In accordance with one embodiment, by grounding ground. terminals 120, integrated shield 128 is also grounded.

In accordance with this embodiment, substrate shielding portion 132 is a rectangular annulus parallel to upper surface 102U of substrate 102. Substrate shielding portion 132 of integrated shield 128 extends to the periphery of upper surface 102U to cover the entire upper surface 102U of substrate 102. Substrate shielding portion 132 may be slightly larger than upper surface 102U to insure that substrate 102 fits within the area of substrate shielding portion 132.

Substrate shielding portion 132 has four inner edges 146 and four outer edges 148. Inner edges 146 define an inner rectangular periphery of substrate shielding portion 132 and outer edges 148 define an outer rectangular periphery of substrate shielding portion 132. In light of this disclosure, those of skill in the art will understand that the intersection of edges 146 and edges 148 may not be exactly perpendicular, but may be slightly rounded.

The distance D1 between upper surface 102U and of substrate shielding portion 132 is less than the distance D2 between upper surface 102U and electronic component shielding portion 130. Electronic component to substrate transition shield portion 134 connects electronic component shielding portion 130 to substrate shielding portion 132. More particularly, electronic component to substrate transition shield portion. 134 extends between and connects edges 142 of electronic component shielding portion 130 to inner edges 146 of substrate shielding portion 132.

To make up for the different heights of electronic component shielding portion 130 and substrate shielding portion 132, electronic component to substrate transition shield portion 134 is sloped downwards from electronic component shielding portion 130 to substrate shielding portion 132.

Electronic component shielding portion 130, substrate shielding portion 132, and electronic component to substrate transition shield portion 134 collectively cover and provide an electromagnetic interference (EMI) shield for electronic component 104 and upper surface 102U of substrate 102. Stated another way, electronic component shielding portion 130, substrate shielding portion 132, and electronic component to substrate transition shield portion 134 collectively prevent EMI from electronic component 104 and upper surface 102U of substrate 102 from interfering with surrounding devices as well as prevent any EMI from the surrounding devices from interfering with electronic component 104 and upper surface 102U, of substrate 102.

Side shielding portion 136, sometimes called vertical extensions, extends downwards from outer edges 148 of substrate shielding portion 132 around sides 102S of substrate 102. Side shielding portion 136 includes four sidewalls 150A, 150B, 150C, 150D, collectively sidewalls 150. It is to be understood that sidewalls 150C, 150D would not be visible in the view of FIG. 2 and so are indicated in dashed lines for clarity of presentation.

Side shielding portion 136 including sidewalls 150 extend perpendicularly downward in a direction towards substrate 102 from substrate shielding portion 132. Sidewalls 150A, 150C are parallel to one another and perpendicular to sidewalls 150B, 150D. Sidewalls 150 intersect one another at corners 152 of side shielding portion 136.

Each sidewall 150 includes an upper edge 148, which also defines the outer edges 148 of substrate shielding portion 132. Stated another way, edges 148 define the transition between substrate shielding portion 132 and sidewalls 150. Edges 148 may be sharp corners ta smooth curves depending upon the manufacturing technique used to form integrated shield 128 as those of skill in the art will understand.

Each sidewall 150 further includes a lower edge 154 parallel to the respective upper edge 148. Each sidewall 150 further includes side edges 156 extending perpendicularly between the respective upper edge 148 and lower edge 154. As discussed above, integrated shield 128 can be continuous such that sidewalls 150 are joined to the adjacent sidewalls 150 at side edges 156. Alternatively, cuts 138 are formed between each sidewall 150 such that sidewalls 150 are in abutting contact to the adjacent sidewalls 150 at side edges 156.

Lower edges 154 collectively define a lower rectangular annular edge 158 of side shielding portion 136. Lower rectangular annular edge 158 of side shielding portion 136 extends between an inner surface 160 of integrated shield 128 and an outer surface 162 of integrated shield 128. Accordingly, the width W of lower rectangular annular edge 158 is equal to the thickness of integrated shield 128. Lower rectangular annular edge 158 is generally a flat surface, although may be curved or deformed slightly.

Lower rectangular annular edge 158 defines the lowest portion of integrated shield 128. In accordance with this embodiment, lower rectangular annular edge 158 is parallel to and coplanar with lower surface 102L of substrate 102. Accordingly, side shielding portion 136 of integrated shield 128 is directly adjacent to and covers sides 102S of substrate 102. Side shielding portion 136 is parallel to sides 102S and perpendicular to upper surface 102U and substrate shielding portion 132.

By covering sides 102S of substrate 102, side shielding portion 136 provides an electromagnetic interference (EMI) shield for sides 102S of substrate 102. Stated another way, side shielding portion 136 prevents EMI emanating from sides 102S of substrate 102 from interfering with surrounding devices as well as prevents any EMI from the surrounding devices from entering into sides 102S of substrate 102 and interfering with integrated shield electronic component package 100.

Although lower rectangular annular edge 158 is illustrated and described above as being parallel to and coplanar with lower surface 102L of substrate 102, in another embodiment, lower rectangular annular edge 158 is located below upper surface 102U yet above lower surface 102L. In accordance with this embodiment, side shielding portion 136 of integrated shield 128 is directly adjacent to and covers the upper portion of sides 102S of substrate 102 while exposing the lower portion of sides 102S. When it is said that a feature such as lower rectangular annular edge 158 is above or below a surface, e.g., upper surface 102U and/or lower surface 102L, it is to be understood that what is meant is that a plane coplanar with the feature is above or below a plane coplanar with the surface.

In one embodiment, to fabricate integrated shield electronic component package 100, electronic component 104 is flip chip mounted to substrate 102 by flip chip bumps 116. Optionally, underfill 118 is applied. Integrated shield 128 is mounted to electronic component 104 and upper surface 102U of substrate 102 by thermal interface material 140 and/or shield adhesive material 144. Integrated shield 128 is mounted such that side shielding portion 136 extends around and covers sides 102S of substrate 102. Interconnection balls 126 are formed after mounting of integrated shield 128, although are formed at earlier stages during fabrication in accordance with other embodiments.

As set forth above, integrated shield 128 is mounted to substrate 102 by shield attach material 144 and/or to electronic component 104 by thermal interface material 140. Accordingly, integrated shield electronic package 100 includes integrated shield 128. Stated another way, integrated shield 128 is integrated within integrated shield electronic package 100. Thus, separate operations of mounting an electronic component package and then mounting a shield are avoided thus simplifying manufacturing and reducing overall assembly costs.

Figure 3:
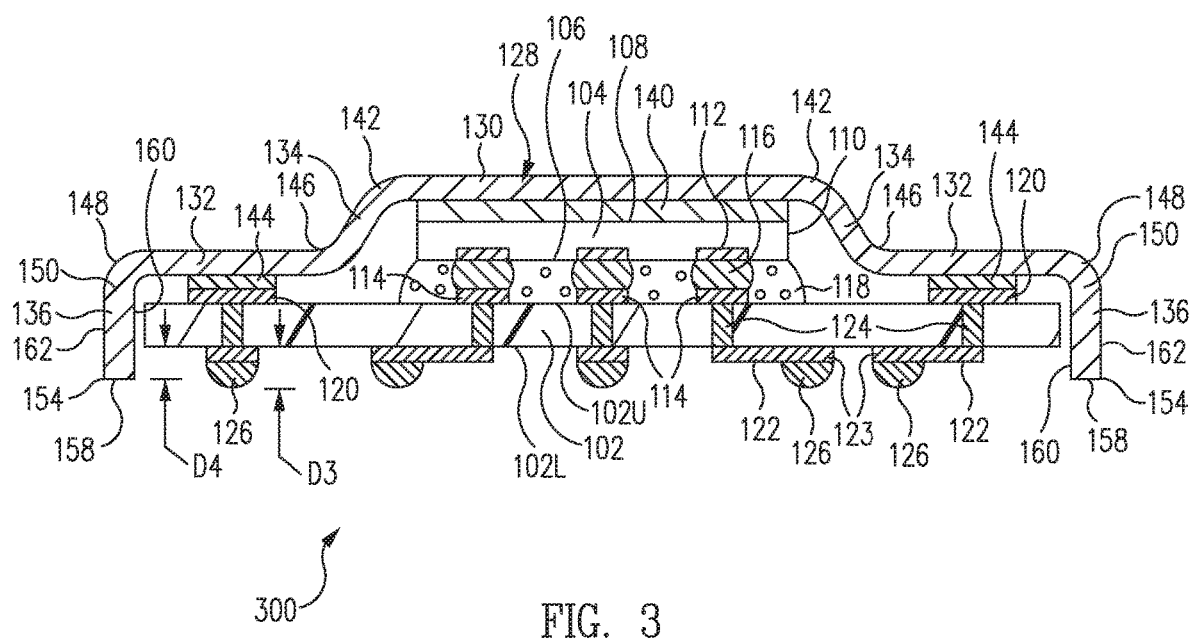
FIG. 3 is a cross-sectional view of an integrated shield electronic component package in accordance with another embodiment.

FIG. 3 is a cross-sectional view of an integrated shield electronic component package 300 in accordance with another embodiment. Integrated shield electronic component package 300 of FIG. 3 is similar to integrated shield electronic component package 100 of FIG. 1 and only the significant differences between integrated shield electronic component packages 300, 100 are discussed below.

More particularly, integrated shield electronic component package 300 is identical to integrated shield electronic component package 100 except that side shielding portion 136 protrudes downwards past lager surface 102L of substrate 102 in integrated shield electronic component package 300.

Referring now to FIG. 3, side shielding portion 136 extends downwards below lower surface 102L to overlap a portion of interconnection balls 126. More particularly, interconnection balls 126 protrudes vertically downwards a pre-reflow distance D3 below lower surface 102L of substrate 102 in a plane perpendicular to lower surface 102L. Lower rectangular annular edge 158, i.e., a plane coplanar thereto, protrudes vertically downwards a side shielding portion distance D4 below lower surface 102L of substrate 102 in a plane perpendicular to lower surface 102L. Side shielding portion distance D4 of lower rectangular annular edge 158 is less than pre-reflow distance D3 of interconnection bails 126.

By overlapping and covering a portion of interconnection balls 126, side shielding portion 136 provides an electromagnetic interference (EMI) shield for interconnection balls 126 and lower surface 102L of substrate 102. Stated another way, side shielding portion 136 prevents EMI emanating from interconnection balls 126 and lower surface 102L from interfering with surrounding devices as well as prevents any EMI from the surrounding devices from entering into interconnection balls 126 and lower surface 102L and interfering with integrated shield electronic component package 300.

Figure 4:
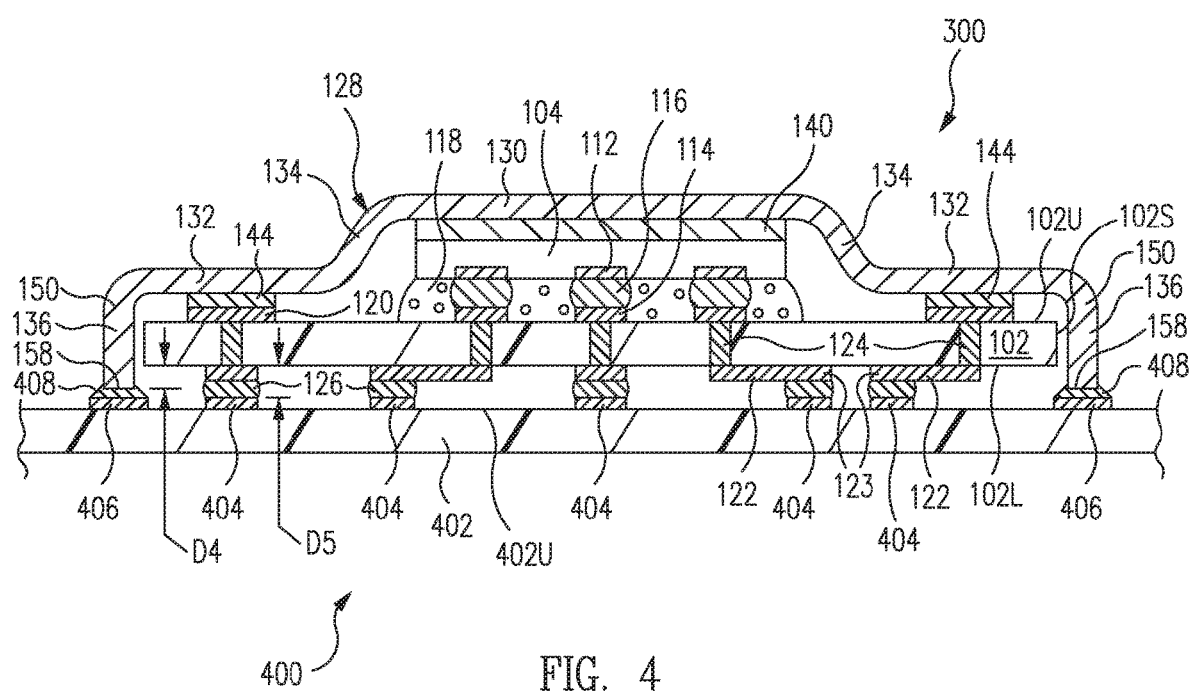
FIG. 4 is a cross-sectional view of an integrated shield electronic component package assembly formed with the integrated shield electronic component package of FIG. 3 in accordance with one embodiment.

FIG. 4 is a cross-sectional view of an integrated shield electronic component package assembly 400 formed with integrated shield electronic component package 300 of FIG. 3 in accordance with one embodiment.

Referring now to FIG. 4, integrated shield electronic component package 300 is mounted to a larger substrate 402, sometimes called a board assembly or motherboard, to form integrated shield electronic component package assembly 400.

Larger substrate 402 includes an upper, e.g., first, surface 402U having terminals 404 and shield terminals 406 formed thereon. Lower traces 122, e.g., terminals 123 thereof, are physically and electrically connected to terminals 404 by interconnection balls 126. More particularly, interconnection balls 126 are placed into contact with terminals 404. Assembly 400 is heated to reflow, i.e., melt and resolidify, interconnection balls 126.

During the reflow, interconnection balls 126 collapse from the state illustrated in FIG. 3. More particularly, after reflow, interconnection balls 126 protrude vertically downwards a post-reflow distance D5 below lower surface 102L of substrate 102 in a plane perpendicular to lower surface 102L. Side shield portion distance D4 of lower rectangular annular edge 158 is less than post-reflow distance D5 of interconnection balls 126. This prevents integrated shield 128 from interfering with reflow of interconnection balls 126.

Optionally, as illustrated in FIG. 4, side shielding portion 136 including lower rectangular annular edge 158 is physically and electrically connected to shield terminals 406 by shield adhesive 408, e.g., electrically conductive adhesive, solder, or other electrically conductive material. Accordingly, integrated shield 128 is electrically connected to shield terminals 406.

Accordingly, a reference voltage source, e.g., ground, applied to shield terminals 406 is coupled to integrated shield 128 through shield adhesive 408. In accordance with one embodiment, by grounding shield terminals 406, integrated shield 128 is also grounded. Stated another way, integrated shield 128 has a direct path to motherboard ground.

In another embodiment, larger substrate 402 is formed without shield terminals 406. Shield adhesive 408, which can be a dielectric in this embodiment, is applied between lower rectangular annular edge 158 and upper surface 402U of larger substrate 402. In this manner, shield adhesive 408 provides a mechanical attachment of integrated shield 128 to larger substrate 402 to provide a robust attachment of integrated shield electronic component package 300 to larger substrate 402.

In another embodiment, larger substrate 402 is formed without shield terminals 406 and shield adhesive 408 is not applied. Accordingly, lower rectangular annular edge 158 is in abutting contact with or slightly spaced above upper surface 402U of larger substrate 402. In one embodiment, the exact spacing between lower rectangular annular edge 158 and upper surface 402U of larger substrate 402 is based on electrical performance requirements, e.g., the spacing is set so that only an acceptable amount of EMI escapes from integrated shield 128.

Although integrated shield electronic component package assembly 400 is illustrated as being formed with integrated shield electronic component package 300 of FIG. 3, in another embodiment, integrated shield electronic component package 100 of FIG. 1 is mounted to larger substrate 402 to form an integrated shield electronic component package assembly.

Although specific embodiments were described herein, the scope of the invention is not limited to those specific embodiments. Numerous variations, whether explicitly given in the specification or not, such as differences in structure, dimension, and use of material, are possible. The scope of the invention is at least as broad as given by the following claims.

What is claimed is:

1. An integrated shield electronic component package comprising:
   a substrate comprising a first surface, a second surface, and sides extending between the first surface and the second surface;
   terminals coupled to the second surface;
   interconnection structures coupled to the terminals of the second surface; and
   an integrated shield of uniform thickness coupled to the first surface of the substrate and comprising a side shielding portion fully covering the sides of the substrate;
   wherein there is no solder material at any portion of:
      a first side area between a first side of the substrate and a corresponding first side shielding portion of the integrated shield that faces the first side of the substrate; and
      a second side area between a second side of the substrate and a corresponding second side shielding portion of the integrated shield that faces the second side of the substrate.

2. The integrated shield electronic component package of claim 1 wherein the side shielding portion extends a side shielding portion distance below the second surface of the substrate and the interconnection structures extend a post-reflow distance below the second surface of the substrate, the side shielding portion distance being less than the post-reflow distance.

3. The integrated shield electronic component package of claim 1 wherein the interconnection structures comprise interconnection balls.

4. The integrated shield electronic component package of claim 1 wherein the integrated shield is attached to a first terminal of the first surface via solder material.

5. The integrated shield electronic component package of claim 1 wherein the integrated shield is attached to a first terminal of the first surface via a conductive adhesive.

6. The integrated shield electronic component package of claim 1 wherein an upper surface of the integrated shield comprises a first portion, a second portion, and a rounded portion between the first portion and the second portion.

7. A packaged electronic component comprising:
- a substrate comprising a first surface having a shield-attach terminal, a second surface, and sides extending between the first surface and the second surface;
- an electronic component coupled to first terminals of the first surface;
- interconnection structures coupled to second terminals of the second surface; and
- an integrated shield of uniform thickness coupled to the first surface of the substrate and comprising a side shielding portion fully covering the sides of the substrate;
- wherein there is no solder material at any portion of:
  - a first side area between a first side of the substrate and a corresponding first side shielding portion of the integrated shield that faces the first side of the substrate; and
  - a second side area between a second side of the substrate and a corresponding second side shielding portion of the integrated shield that faces the second side of the substrate.

8. The packaged electronic component of claim 7 wherein the side shielding portion extends a side shielding portion distance below the second surface of the substrate and the interconnection structures extend a post-reflow distance below the second surface of the substrate, the side shielding portion distance being less than the post-reflow distance.

9. The packaged electronic component of claim 7 wherein:
- the integrated shield is coupled to a shield-attach structure that is conductive and that extends from the shield-attach terminal of the first surface of the substrate;
- the shield-attach terminal is on the first surface and bounded by the a perimeter of the first surface; and
- a width of a base of the shield-attach structure is bounded by a width of the shield- attach terminal.

10. The packaged electronic component of claim 7 wherein the integrated shield is attached to a shield-attach structure of solder material that extends only over the first surface of the substrate and is coupled to the shield-attach terminal.

11. The packaged electronic component of claim 7 wherein the integrated shield is attached to a shield-attach structure of conductive adhesive that extends only over the first surface of the substrate and is coupled to the shield-attach terminal.

12. The packaged electronic component of claim 7, wherein the interconnection structures comprise:
- a first interconnection structure electrically coupled to the integrated shield; and
- a second interconnection structure electrically coupled to the electronic component.

13. The packed electronic component of claim 7, wherein an upper surface of the integrated shield comprises a first portion, a second portion, and a rounded portion between the first portion and the second portion.

14. A method of fabricating an integrated shield electronic component package, the method comprising:
- applying an integrated shield of uniform thickness to a first surface of a substrate comprising the first surface, a second surface, and sides extending between the first surface and the second surface such that a side shielding portion of the integrated shield fully covers the sides of the substrate; and
- coupling interconnection structures to terminals coupled to the second surface;
- wherein said applying the integrated shield applies the integrated shield to the first surface such that there is no solder material at any portion of:
  - a first side area between a first side of the substrate and a corresponding first side shielding portion of the integrated shield that faces the first side of the substrate; and
  - a second side area between a second side of the substrate and a corresponding second side shielding portion of the integrated shield that faces the second side of the substrate.

15. The method of claim 14 wherein:
- said coupling the interconnection structures to the terminals extends the interconnections structures a post-reflow distance below the second surface of the substrate; and
- said applying the integrated shield to the first surface extends the side shielding portion a side shielding portion distance below the second surface of the substrate, the side shielding portion distance being less than the post-reflow distance.

16. The method of claim 14 wherein coupling the interconnection structures to the terminals comprises attaching interconnection balls to the terminals.

17. The method of claim 14 wherein coupling applying the integrated shield to the first surface comprises attaching the integrated shield to a first terminal of the first surface via the solder material.

18. The method of claim 14 wherein coupling applying the integrated shield to the first surface comprises attaching the integrated shield to a first terminal of the first surface via a conductive adhesive.

19. The method of claim 14 further comprising forming an upper surface of the integrated shield such that the integrated shield comprises a first portion, a second portion, and a rounded portion between the first portion and the second portion.

* * * * *